United States Patent
Huang et al.

(10) Patent No.: US 9,543,152 B2
(45) Date of Patent: Jan. 10, 2017

(54) MIM CAPACITORS FOR LEAKAGE CURRENT IMPROVEMENT

(71) Applicant: TAIWAN SEMICONDUCTOR MANUFACTURING CO., LTD., Hsinchu (TW)

(72) Inventors: Ching-Hung Huang, Erlin Township (TW); Bo-Chang Su, Tainan (TW); Chih-Ho Tai, Tainan (TW); Wen-Tsao Chen, Tainan (TW); Kuan-Chi Tsai, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 106 days.

(21) Appl. No.: 14/322,501

(22) Filed: Jul. 2, 2014

(65) Prior Publication Data

US 2016/0005805 A1    Jan. 7, 2016

(51) Int. Cl.
*H01L 49/02* (2006.01)
*H01L 21/263* (2006.01)
*H01L 21/311* (2006.01)

(52) U.S. Cl.
CPC ........ *H01L 21/263* (2013.01); *H01L 21/31111* (2013.01); *H01L 28/60* (2013.01)

(58) Field of Classification Search
CPC ..................... H01L 2924/0002; H01L 2924/00; H01L 28/40; H01L 23/5223
USPC .. 257/E21.008, 306, 758, E21.011; 438/393, 957
See application file for complete search history.

(56) References Cited

U.S. PATENT DOCUMENTS

| | | | | |
|---|---|---|---|---|
| 6,342,734 B1* | 1/2002 | Allman | ............ | H01L 21/32051 257/296 |
| 6,713,840 B1* | 3/2004 | Lee | ................... | H01L 21/76829 257/532 |
| 7,042,041 B2* | 5/2006 | Nakashima | ......... | H01L 23/5223 257/303 |
| 7,602,599 B1* | 10/2009 | Hsu | ........................ | H01G 4/005 361/303 |
| 2006/0281329 A1* | 12/2006 | RamachandraRao | | H01L 21/02118 438/778 |
| 2012/0181657 A1* | 7/2012 | Wu | ..................... | H01L 23/5223 257/532 |

* cited by examiner

*Primary Examiner* — David Vu
*Assistant Examiner* — Jonathan Han
(74) *Attorney, Agent, or Firm* — Maschoff Brennan

(57) ABSTRACT

The semiconductor device includes a substrate, a bottom electrode, a capacitor dielectric layer, a top electrode, an etching stop layer, a first anti-reflective coating layer and a capping layer. The bottom electrode is on the substrate. The capacitor dielectric layer is on the bottom electrode. The capacitor dielectric layer has a first region and a second region adjacent to the first region. The top electrode is on the first region of the capacitor dielectric layer. The etching stop layer is on the top electrode. The first anti-reflective coating layer is on the etching stop layer, in which the first anti-reflective coating layer, the etching stop layer and the top electrode together have a sidewall. The capping layer overlies the sidewall, the etching stop layer, the second region of the capacitor dielectric layer, in which the capping layer is formed from oxide or nitride.

20 Claims, 14 Drawing Sheets

MIM CAPACITORS FOR LEAKAGE CURRENT IMPROVEMENT

BACKGROUND

Capacitors are elements that are used extensively in semiconductor devices for storing an electrical charge. The capacitors are used in filters, analog-to-digital converters, memory devices, control applications, and many other types of semiconductor devices. One type of the capacitors is a metal-insulator-metal (MIM) capacitor, which is frequently used in mixed signal devices and logic devices, as examples. MIM capacitors are used to store a charge in a variety of semiconductor devices. The MIM capacitors are often used as a storage node in a memory device, for example. A MIM capacitor is typically formed horizontally on a semiconductor wafer, with two metal plates sandwiching a dielectric layer parallel to a surface of the semiconductor wafer.

In general, contact plugs are respectively electrically connected to the two metal plates, but the contact plugs are electrically isolated from each other. In order to form the contact plugs, one of the two metal plates is partially etched and refilled with dielectric material. Then, the contact plugs pass through the dielectric material and are electrically connected to the two metal plates respectively. However, when the metal plate is partially etched, impurities are produced and are residual on a sidewall of the remaining portion of the metal plate. The impurities result in an electron path with a low resistance for electrons when the MIM capacitor is charged, and thus induce a leakage current of the MIM capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
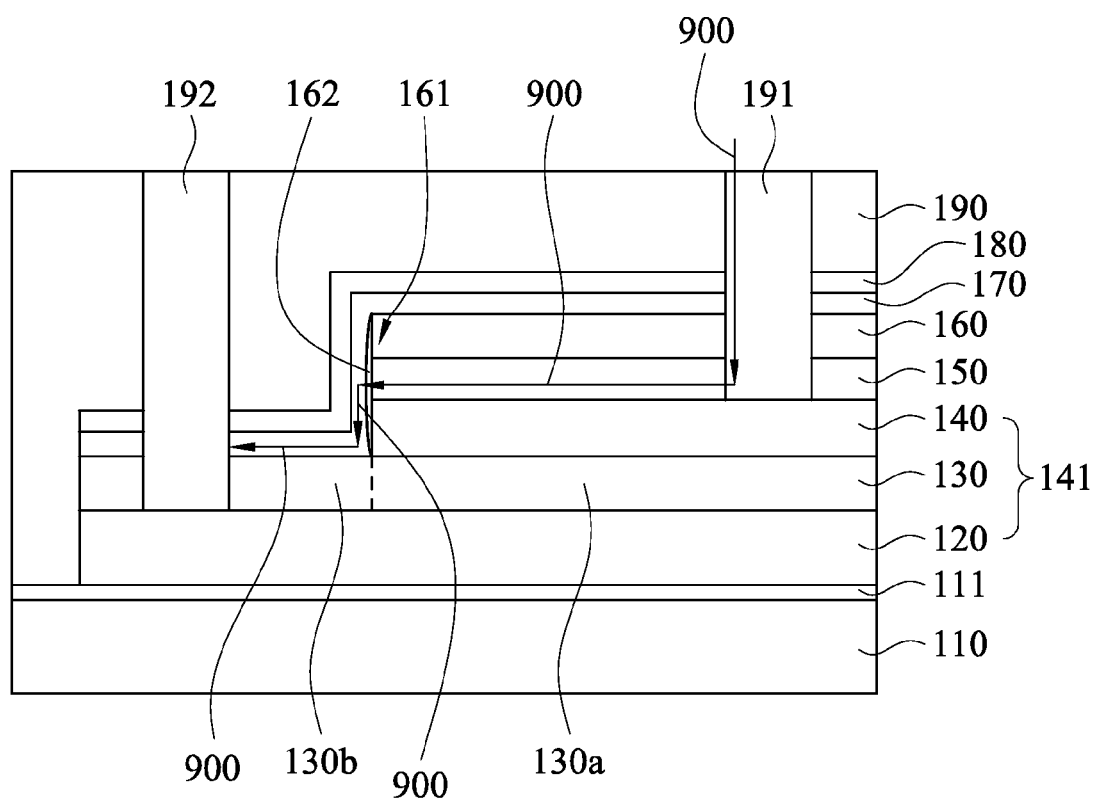
FIG. 1 is a schematic cross-sectional diagram of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to a semiconductor device (such as a signal device or a logic device) with a MIM capacitor, in which the semiconductor device has a capping layer (formed from oxide or nitride) overlying a sidewall (formed from a first anti-reflective coating layer, an etching stop layer and a top electrode which are located on a first region of a capacitor dielectric layer together), an etching stop layer and a second region of the capacitor dielectric layer. The capping layer is used to cover impurities (usually including polymers or particles caused by an etching operation using an etching solution mixed with etching reactants), so as to prevent or at least improve, a leakage current of the MIM capacitor caused by the impurities.

In various embodiments of the present disclosure, a method for fabricating a semiconductor device (such as a signal device or a logic device) with a MIM capacitor is provided, in which, after removing portions of a first anti-reflective coating layer, an etching stop layer and a top electrode over a second region of the capacitor dielectric layer, a plasma treatment is performed to remove impurities caused by the removing operation, thus preventing or at least improving, a leakage current of the MIM capacitor caused by the impurities.

FIG. 1 is a schematic cross-sectional diagram of a semiconductor device 100 in accordance with some embodiments. As shown in FIG. 1, the semiconductor device 100 includes a substrate 110, a bottom electrode 120, a capacitor dielectric layer 130, a top electrode 140, an etching stop layer 150, a first anti-reflective coating layer 160 and a capping layer 170.

The substrate 110 is defined as any construction including semiconductor materials including, but is not limited to, bulk silicon, a semiconductor wafer, a silicon-on-insulator (SOI) substrate, or a silicon germanium substrate. Other semiconductor materials including group III, group IV, and group V elements may also be used. The substrate 110 may contain a variety of elements including, for example, transistors, resistors, and other semiconductor elements. In order to simplify the diagram, a flat substrate is depicted.

In some embodiments, the semiconductor device 100 may include a dielectric layer 111 serving as an interlayer dielectric or intermetal dielectric layer overlying the substrate 110. For example, the dielectric layer 111 may include silicon dioxide, phosphosilicate glass (PSG), borophosphosilicate glass (BPSG). In certain embodiments, the dielectric layer 111 includes a low dielectric constant (k) material to achieve low RC (resistance-capacitance) time constant, such as fluorosilicate glass (FSG). The dielectric layer 111 can be formed by deposition, such as plasma enhanced chemical vapor deposition (PECVD), low pressure CVD (LPCVD), atmospheric pressure CVD (APCVD), high-density plasma CVD (HDPCVD) or another suitable CVD. Additionally, a multiple level metal structure may be disposed in the dielectric layer 111 for electrically connecting the elements in or on the substrate 110 to the electronic devices subsequently formed thereon. Like the substrate 110, a flat dielectric layer is depicted in order to simplify the diagram.

The bottom electrode 120 is disposed on the substrate 110. In some embodiments, the bottom electrode 120 is formed from aluminum. However, other conductive materials, such as copper, tungsten, metal alloys, and metal silicides also can be used for forming the bottom electrode 120. In certain embodiments, the bottom electrode 120 has a thickness ranging from about 10 Å to about 1500 Å.

The capacitor dielectric layer 130 is disposed on the bottom electrode 120. The capacitor dielectric layer 130 has a first region 130a and a second region 130b adjacent to the first region 130a. In some embodiments, the capacitor dielectric layer 130 is formed from a high-k material, such as silicon oxide and/or silicon oxynitride.

The top electrode 140 is disposed on the first region 130a of the capacitor dielectric layer 130. In some embodiments, the top electrode 140 is formed from aluminum. However, other conductive materials, such as copper, tungsten, metal alloys, and metal silicides also can be used for forming the top electrode 140. In some embodiments, the top electrode 140, the capacitor dielectric layer 130 together with the bottom electrode 120 form a metal-insulator-metal (MIM) capacitor 141.

The etching stop layer 150 is disposed on the top electrode 140. The etching stop layer 150 may be formed from, for example, silicon nitride, silicon carbide, and/or silicon oxynitride. In some embodiments, the etching stop layer 150 has a thickness ranging from about 500 Å to 1500 Å.

The first anti-reflective coating layer 160 is disposed on the etching stop layer 150. The first anti-reflective coating layer 160 may be used to reduce reflection from underlying layers, thereby preventing or at least reducing an interference effect of light when an exposure operation is performed, and thus more accurate alignment can be achieved. In some embodiments, the first anti-reflective coating layer 160 is formed from SiON.

The first anti-reflective coating layer 160, the etching stop layer 150 and the top electrode 140 together have a sidewall 161. In some embodiments, the top electrode 140, the etching stop layer 150 and the first anti-reflective coating layer 160 are first disposed on the first region 130a and the second region 130b of the capacitor dielectric layer 130 in sequence, and then are removed from the second region 130b of the capacitor dielectric layer 130 by using an etching operation and remains on the first region 130a of the capacitor dielectric layer 130, thereby forming the sidewall 161 formed from the first anti-reflective coating layer 160, the etching stop layer 150 and the top electrode 140 together. However, impurities 162, including polymers or particles caused by the etching operation using an etching solution mixed with etching reactants, may also be residual on the sidewall 161. The impurities 162 result in an electron path with a low resistance for electrons when the MIM capacitor 141 is charged, and thus induce a leakage current of the MIM capacitor. In order to prevent or at least improve the induced leakage current, the capping layer 170 overlying the sidewall 161, the etching stop layer 150, the second region 130b of the capacitor dielectric layer 130 is formed for blocking the electron path 900 to improve the leakage current of the MIM capacitor, in which the capping layer 170 may be formed from oxide or nitride. In some embodiments, the capping layer 170 may be formed from a high-k material, such as silicon dioxide.

In some embodiments, the semiconductor device 100 may include a second anti-reflective coating layer 180. The second anti-reflective coating layer 180 is disposed on the capping layer 170 for reducing reflection from underlying layers for allowing more accurate alignment, similar to the function of the first anti-reflective coating layer 160. In some embodiments, the second anti-reflective coating layer 180 is formed from SiON.

In some embodiments, the semiconductor device 100 may include an intermetallic dielectric layer 190 disposed on the second anti-reflective coating layer 180. In some embodiments, the intermetallic dielectric layer 190 covers the previously formed structure. In some embodiments, the intermetallic dielectric layer 190 is formed from a low-k dielectric material which is deposited using, for example, tetraethyl ortho silicate (TEOS), CVD, PECVD or low pressure CVD (LPCVD).

In some embodiments, the semiconductor device 100 may include a first contact plug 191. The first contact plug 191 is electrically connected to the top electrode 140, in which the first contact plug 191 passes through the intermetallic dielectric layer 190, the second anti-reflective coating layer 180, the capping layer 170, the first anti-reflective coating layer 160 and the etching stop layer 150. In certain embodiments, the first contact plugs 191 may be formed from tungsten, aluminum or copper.

In some embodiments, the semiconductor device 100 may include a second contact plug 192. The second contact plug 192 is electrically connected to the bottom electrode 120, in which the second contact plug 192 passes through the intermetallic dielectric layer 190 and the second region 130b of the capacitor dielectric layer 130. In certain embodiments, the second contact plugs 192 may be formed from tungsten, aluminum or copper.

Figure 2A:
FIG. 2A-2L are schematic cross-sectional views of intermediate stages showing a method for fabricating a semiconductor device in accordance with some embodiments.

FIG. 2A-2L are schematic cross-sectional views of intermediate stages showing a method for fabricating a semiconductor device 200 in accordance with some embodiments. As shown in FIG. 2A, a substrate 210 is provided. In some embodiments, the substrate 210 may be formed from the materials similar to the materials forming the substrate 110 of FIG. 1. In certain embodiments, the semiconductor device 200 may include a dielectric layer (not shown) serving as an interlayer dielectric or intermetallic dielectric layer overlying the substrate 210.

Figure 2B:
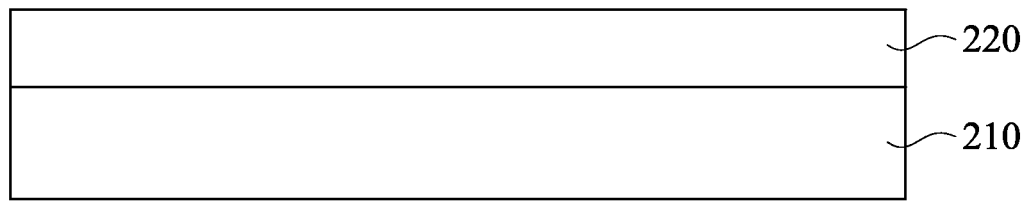

As shown in FIG. 2B, a bottom electrode 220 is formed on the substrate 210. In some embodiments, the bottom electrode 220 may be formed by thermal CVD or atomic layer deposition (ALD). In some embodiments, the bottom electrode 220 may be formed from the materials similar to the materials forming the bottom electrode 120 of FIG. 1.

Figure 2C:
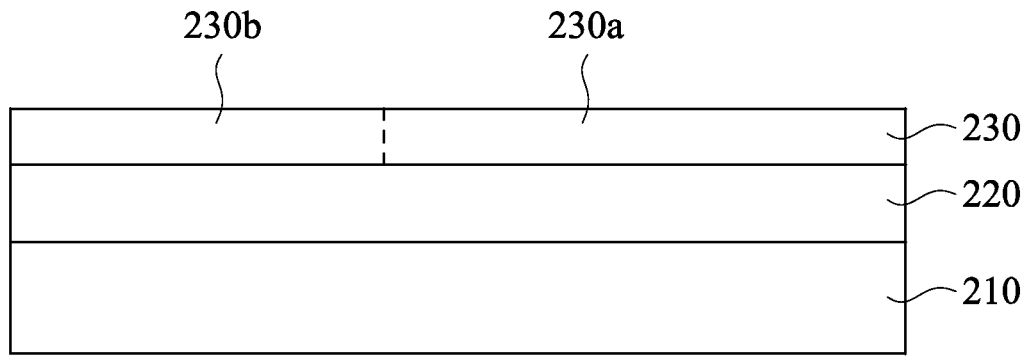

As shown in FIG. 2C, a capacitor dielectric layer 230 is formed on the bottom electrode 220. The capacitor dielectric layer 230 has a first region 230a and a second region 230b adjacent to the first region 230a. In some embodiments, the capacitor dielectric layer 230 may be formed from the materials similar to the materials forming the capacitor dielectric layer 130 of FIG. 1. In certain embodiments, the capacitor dielectric layer 230 is formed using a PECVD operation, although other commonly used operations such as a thermal oxidation (such as for forming $Ta_2O_5$) operation and an atomic layer deposition (ALD) operation (such as for forming HfO$_2$) can also be used.

Figure 2D:
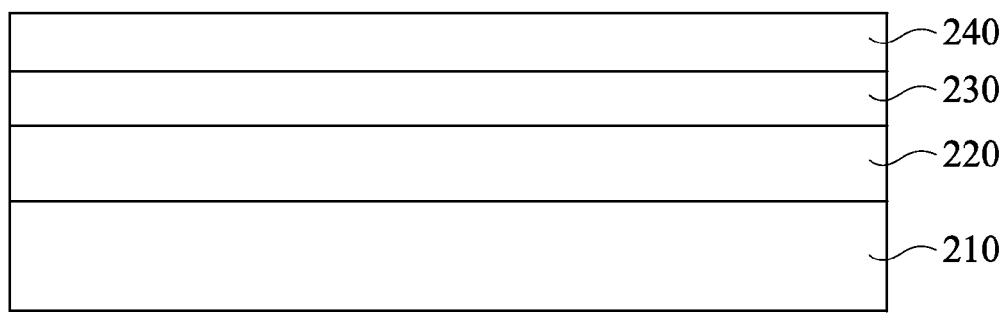

As shown in FIG. 2D, a top electrode 240 is formed on the capacitor dielectric layer 230. In some embodiments, the top electrode 240 may be formed by thermal CVD or ALD. In certain embodiments, the top electrode 240 may be formed from the materials similar to the materials forming the top electrode 140 of FIG. 1.

Figure 2E:
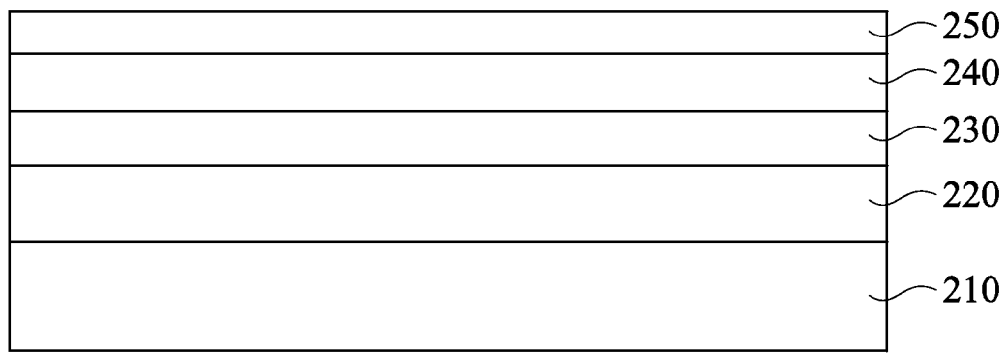

As shown in FIG. 2E, an etching stop layer 250 is formed on the top electrode 240. In some embodiments, the etching stop layer 250 may be formed by PECVD. In certain embodiments, the etching stop layer 250 may be formed from the materials similar to the materials forming the etching stop layer 150 of FIG. 1.

Figure 2F:
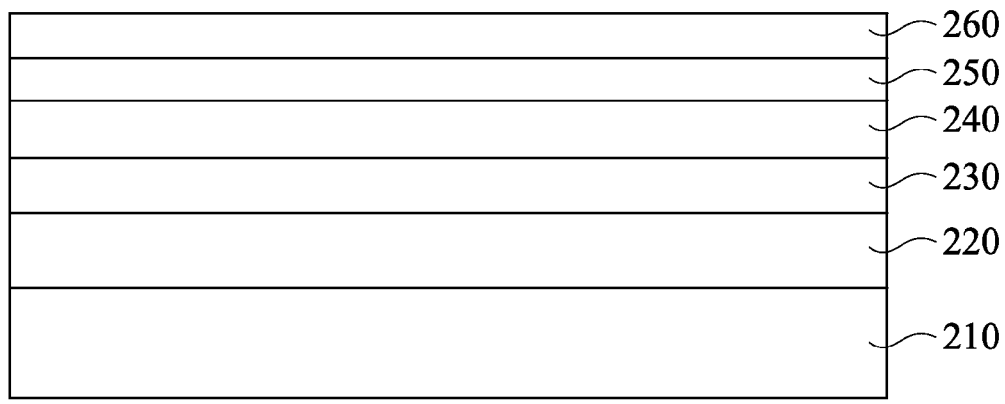

As shown in FIG. 2F, a first anti-reflective coating layer 260 is formed on the etching stop layer 250. In some embodiments, the first anti-reflective coating layer 260 may be formed from the materials similar to the materials forming the first anti-reflective coating layer 160 of FIG. 1.

Figure 2G:
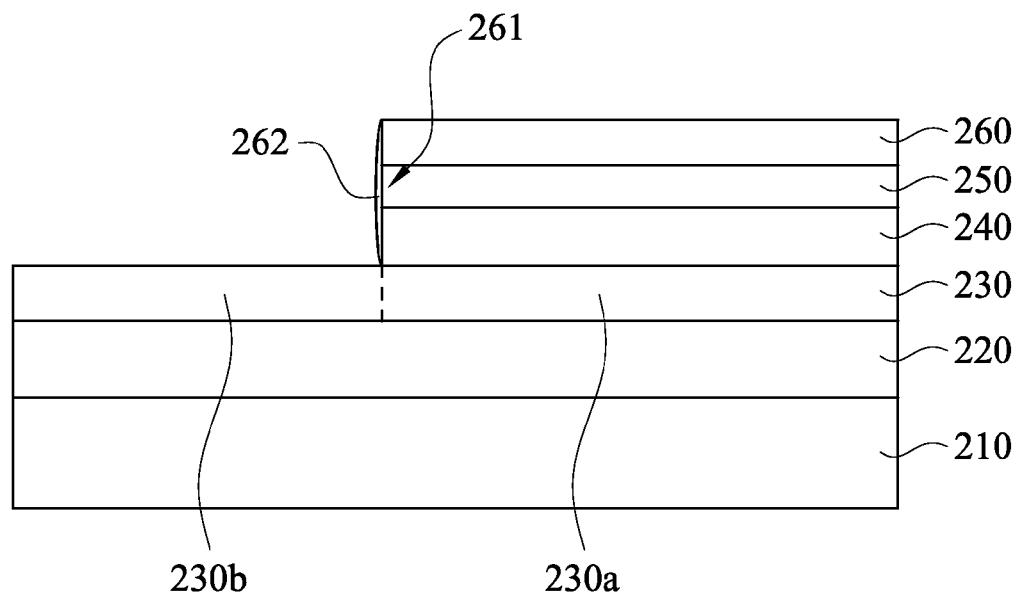
Figure 2H:
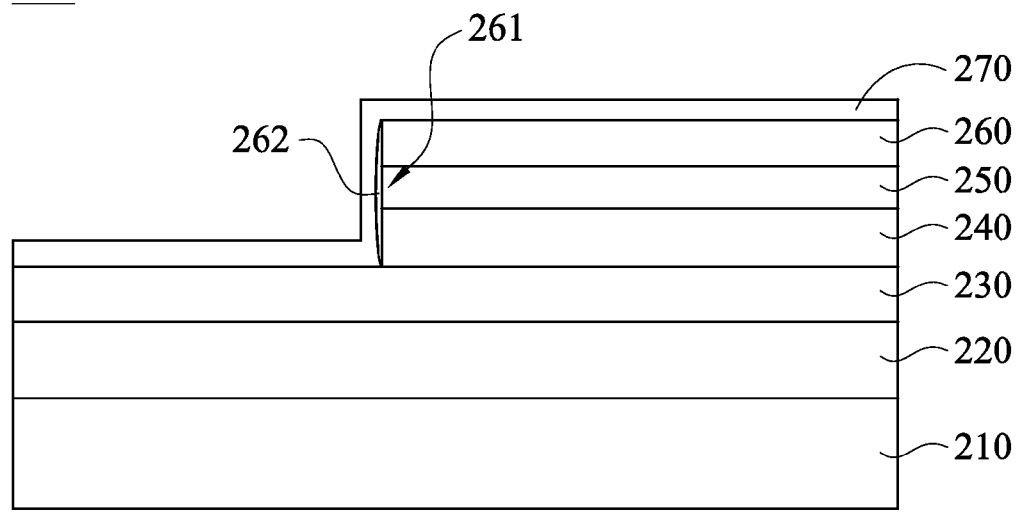

As shown in FIG. 2G, portions of the first anti-reflective coating layer 260, the etching stop layer 250 and the top electrode 240 over the second region 230b of the capacitor dielectric layer 230 are removed. In some embodiments, the portions of the first anti-reflective coating layer 260, the etching stop layer 250 and the top electrode 240 over the second region 230b of the capacitor dielectric layer 230 are removed using an etching operation, and the remaining portions of the first anti-reflective coating layer 260, the etching stop layer 250 and the top electrode 240 together have a sidewall 261. However, impurities 262, including polymers or particles caused by the etching operation using an etching solution mixed with the etching reactants, may be residual on the sidewall 261, and may cause a leakage current, as described above. In order to prevent or at least improve the induced leakage current, as shown in FIG. 2H, a capping layer 270 is deposited on the sidewall 261, the remaining portions of the etching stop layer 250, the second region 230b of the capacitor dielectric layer 230 for blocking the electron path 900 (as shown in FIG. 1), in which the capping layer 270 is formed from oxide or nitride. Therefore, the leakage current induced by the impurities 262 can be improved.

Figure 3:
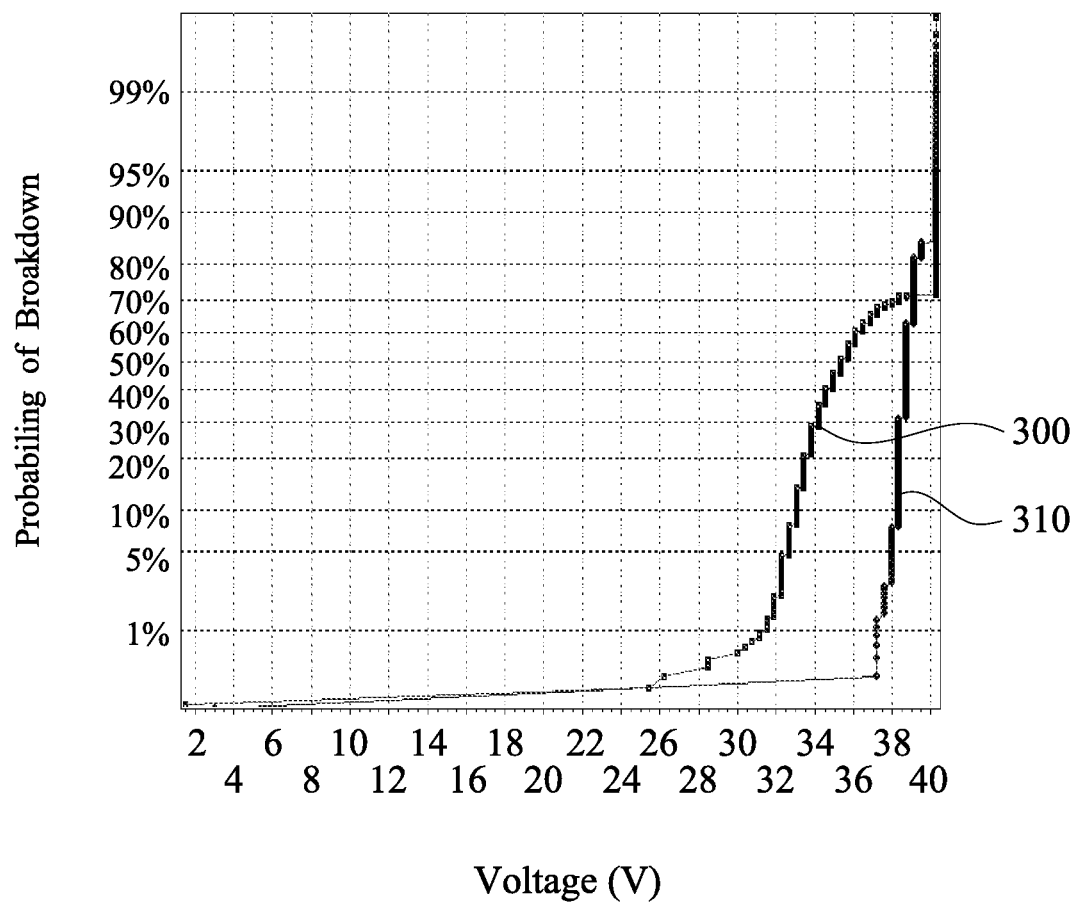
FIG. 3 is a graph showing the relationships between the probability of capacitor breakdown and the applied voltage for the semiconductor device according to the embodiments of the present disclosure and a conventional semiconductor device.

In some embodiments, after the operation of removing the portions of the first anti-reflective coating layer 260, the etching stop layer 250 and the top electrode 240, and before the operation of depositing the capping layer 270 on the remaining portions of the etching stop layer 250 and the second region 230b of the capacitor dielectric layer 230, a plasma treatment is performed on the sidewall 261 for removing impurities 262 on the sidewall 261. In certain embodiments, the operation of the plasma treatment includes using a N$_2$O plasma to remove the impurities 262. Therefore, the leakage current induced by the impurities 262 can be improved. FIG. 3 is a graph showing the relationships between the probability of capacitor breakdown and the applied voltage for the semiconductor device according to the embodiments of the present disclosure and a conventional semiconductor device. As shown in FIG. 3, the semiconductor device 200 of the embodiments of the present disclosure has a relatively high capacitor breakdown voltage than the conventional semiconductor device, in which curve 300 shows the probability of breakdown of the conventional MIM capacitors with no capping layer 270 and no plasma treatment. Curve 310 shows the probability of breakdown of the semiconductor device 200 in which the capping layer 270 is formed and the impurities 262 are removed by using the plasma treatment. It is noted that, at the failure rate (probability of breakdown) of about 1 percent, the breakdown (applied) voltage of the conventional device is about 31.5 V, while that of the semiconductor device 200 of the present disclosure is about 37.5 V. Further, at the failure rate (probability of breakdown) of about 50 percent, the breakdown (applied) voltage of the conventional devices is about 36 V, while that of the semiconductor device 200 of the present disclosure is about 38 V. Therefore, the breakdown (applied) voltage of the semiconductor device 200 of the present disclosure is improved.

Figure 2I:
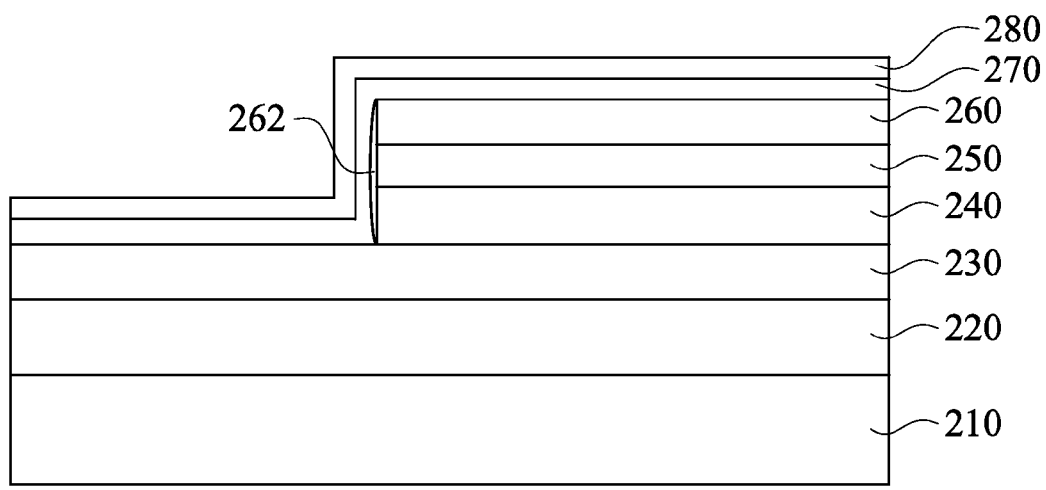
Figure 2J:
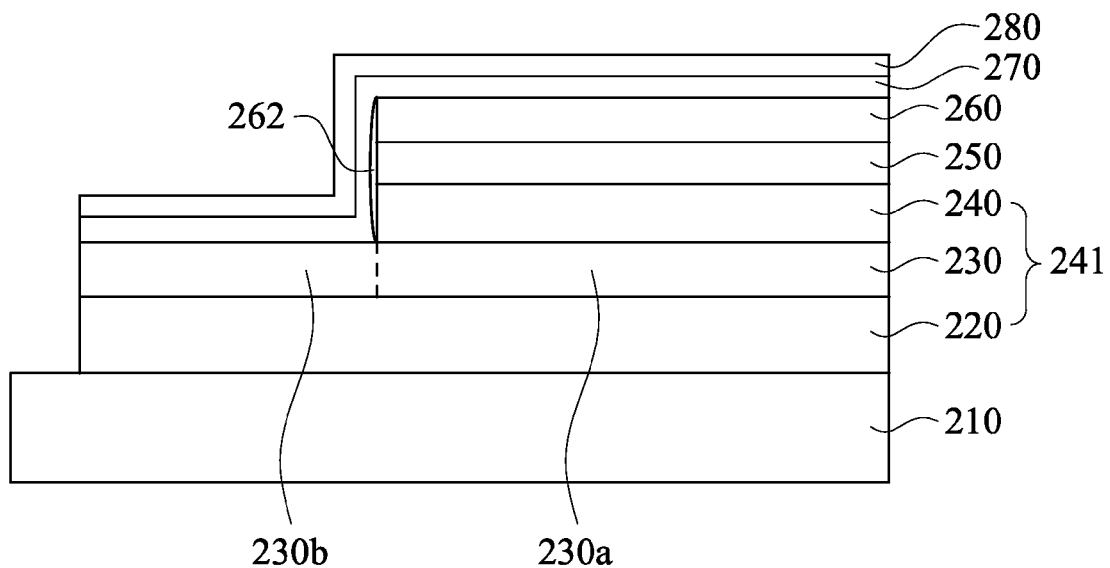

In some embodiments, as shown in FIG. 2I, a second anti-reflective coating layer 280 is formed on the capping layer 270. The second anti-reflective coating layer 280 may be used to reduce reflection from underlying layers for achieving accurate alignments. In some embodiments, the second anti-reflective coating layer 280 may be formed from the materials similar to the materials forming the second anti-reflective coating layer 180 of FIG. 1. In certain embodiments, as shown in FIG. 2J, a patterning operation is performed on the second region 230b of the capacitor dielectric layer 230, thereby forming a MIM capacitor unit 241.

Figure 2K:
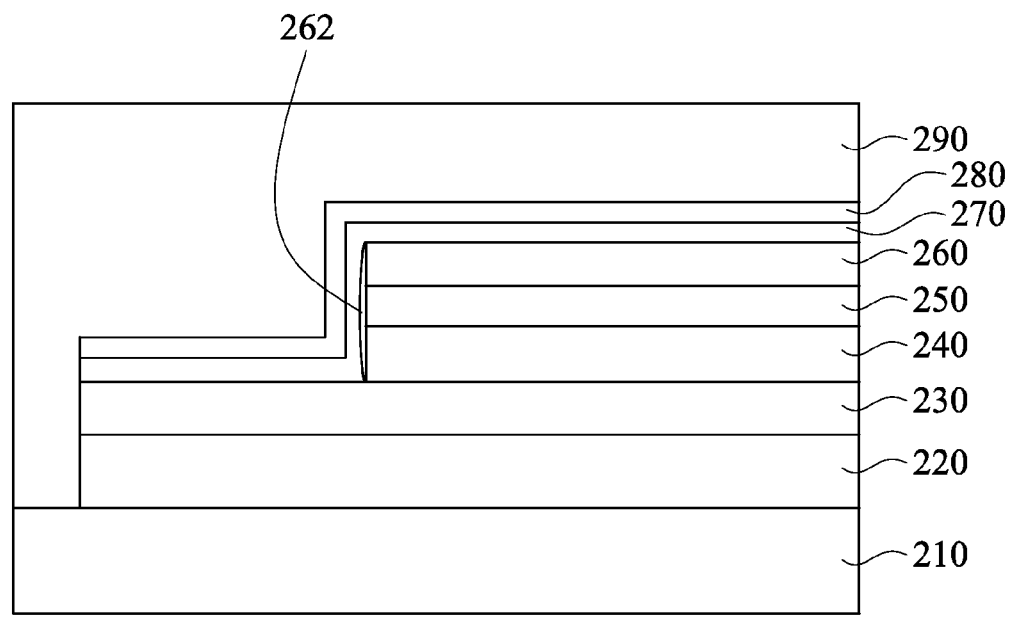

In some embodiments, as shown in FIG. 2K, an intermetallic dielectric layer 290 is formed on the second anti-reflective coating layer 280. In some embodiments, the intermetallic dielectric layer 290 is formed from a low-k dielectric material which is deposited using, e.g., tetraethyl ortho silicate (TEOS), CVD, PECVD or low pressure CVD (LPCVD).

Figure 2L:
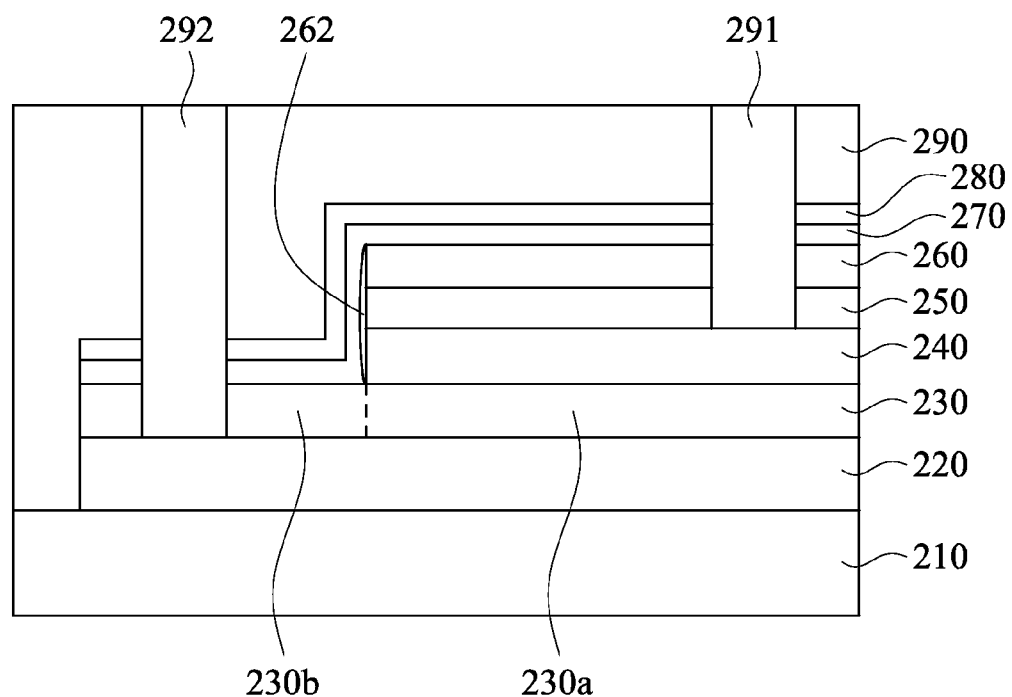

In some embodiments, as shown in FIG. 2L, a first contact plug 291 is formed and electrically connected to the top electrode 240. In certain embodiments, the operation of forming the first contact plug 291 is to first etch the inter metallic dielectric layer 290, the second anti-reflective coating layer 280, the capping layer 270 and the first anti-reflective coating layer 260, thereby forming a first via (not shown), and then fill the first via with a first conductive material to form the first contact plug 291. In some embodiments, the first conductive material is formed from tungsten, aluminum or copper.

In some embodiments, as shown in FIG. 2L, a second contact plug 292 is formed and electrically connected to the bottom electrode 220. In certain embodiments, the operation of forming the second contact plug 292 is to first etch the intermetallic dielectric layer 290 and the second region 230b of the capacitor dielectric layer 230, thereby forming a second via (not shown), and then fill the second via with a second conductive material to form the second contact plug 292. In some embodiments, the second conductive material is formed from tungsten, aluminum or copper.

Figure 4A:
FIG. 4A-4L are schematic cross-sectional views of intermediate stages showing a method for fabricating a semiconductor device in accordance with some embodiments.
Figure 4B:
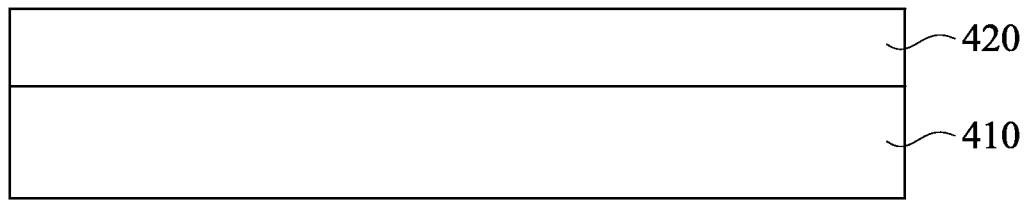
Figure 4C:
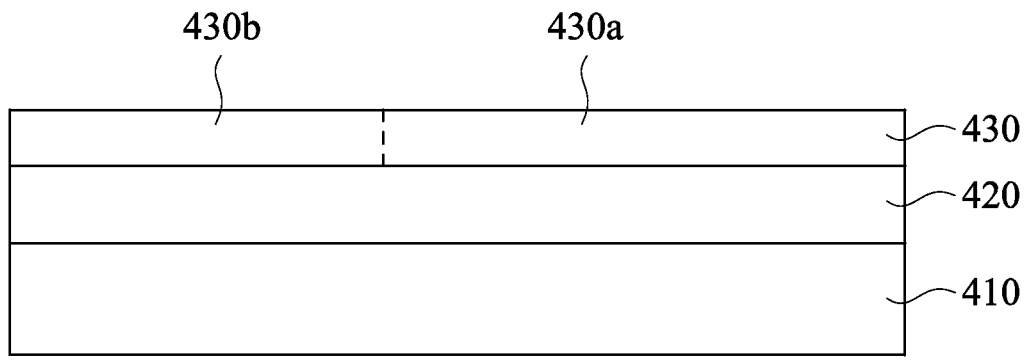
Figure 4D:
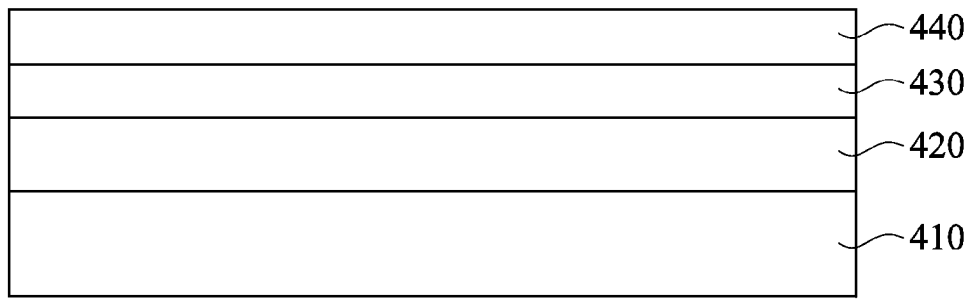
Figure 4E:
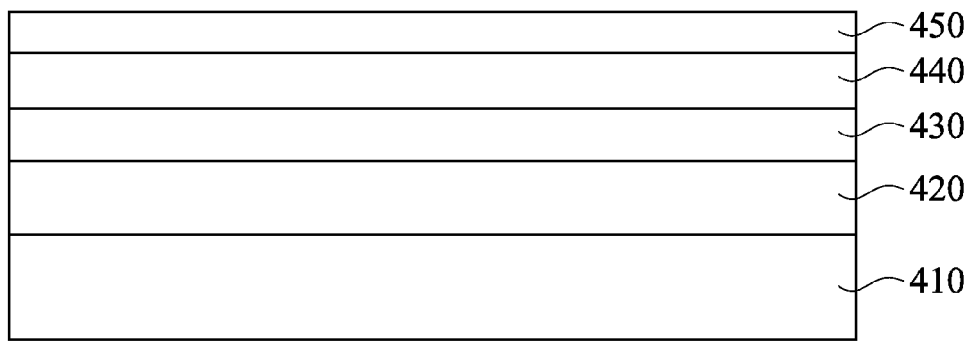
Figure 4F:
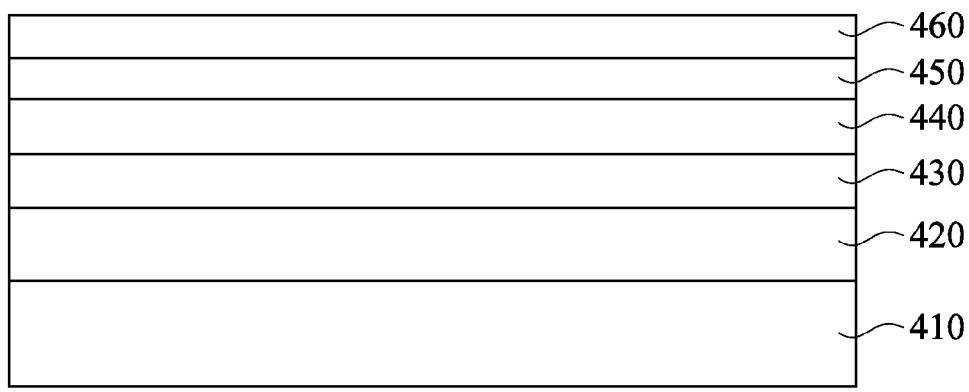
Figure 4G:
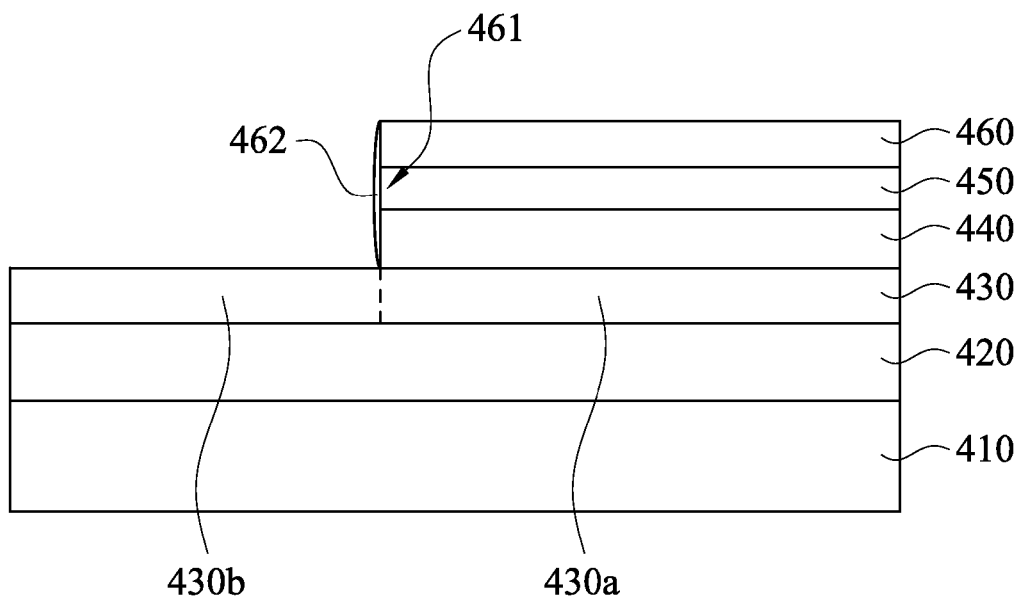
Figure 4H:
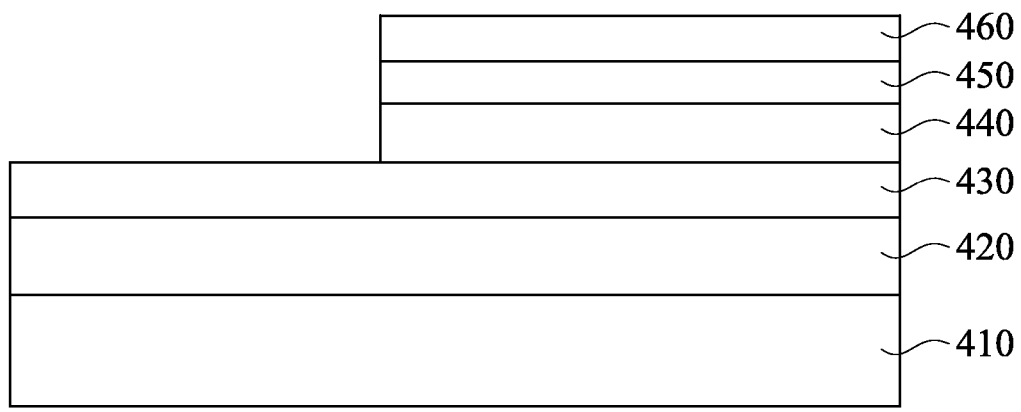

FIG. 4A-4L are schematic cross-sectional views of intermediate stages showing a method for fabricating a semiconductor device 400 in accordance with some embodiments. As shown in FIG. 4A to FIG. 4F, a substrate 410 is provided, and then a bottom electrode 420, a capacitor dielectric layer 430 with a first region 430a and a second region 430b, a top electrode 440, an etching stop layer 450 and a first anti-reflective coating layer 460 are formed using similar operations and materials forming the semiconductor device 200 as shown in FIG. 2A to FIG. 2F. As shown in FIG. 4G, portions of the first anti-reflective coating layer 460, the etching stop layer 450 and the top electrode 440 over the second region 430b of the capacitor dielectric layer 430 are removed using an etching operation, and the remaining portions of the first anti-reflective coating layer 460, the etching stop layer 450 and the top electrode 440 together have a sidewall 461. As described above, impurities 462 may also be residual on the sidewall 461 and cause a leakage current. In order to prevent or at least improve the induced leakage current, as shown in FIG. 4H, a plasma treatment is performed on the sidewall 461 for removing impurities 462 on the sidewall 461. In certain embodiments, the operation of the plasma treatment includes using a N$_2$O plasma to remove the impurities 462. Therefore, the leakage current induced by the impurities 462 can be improved.

Figure 4I:
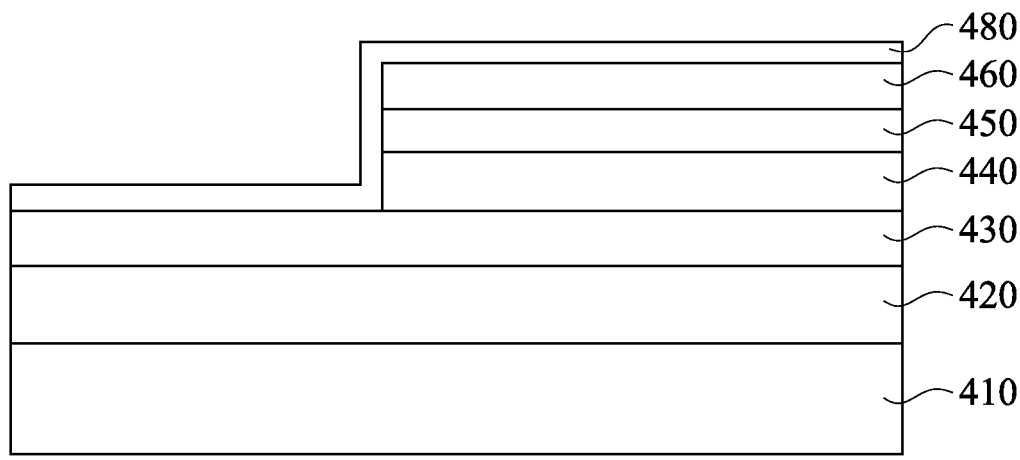
Figure 4J:
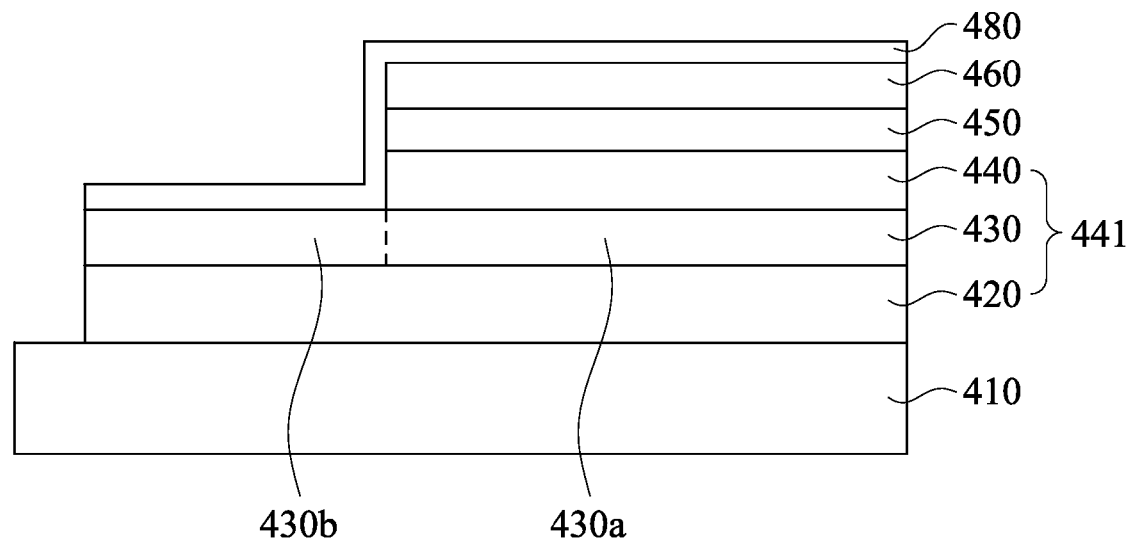

In some embodiments, as shown in FIG. 4I, a second anti-reflective coating layer 480 is formed on the first anti-reflective coating layer 460. The second anti-reflective coating layer 480 may be used to reduce reflection from underlying layers for achieving accurate alignments. In some embodiments, the second anti-reflective coating layer 480 may be formed from the materials similar to the materials forming the second anti-reflective coating layer 280. In certain embodiments, as shown in FIG. 4J, a patterning operation is performed on the second region 430b of the capacitor dielectric layer 430, thereby forming a MIM capacitor unit 441.

Figure 4K:
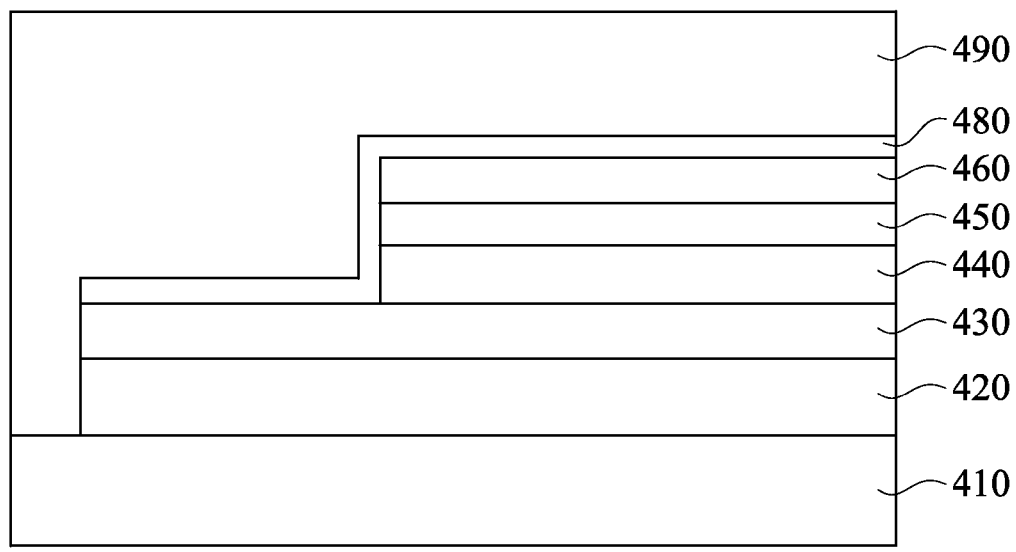

In some embodiments, as shown in FIG. 4K, an intermetallic dielectric layer 490 is formed on the second anti-reflective coating layer 480. In some embodiments, the intermetallic dielectric layer 490 is formed from a low-k dielectric material which is deposited using, e.g., tetraethyl ortho silicate (TEOS), CVD, PECVD or low pressure CVD (LPCVD).

Figure 4L:
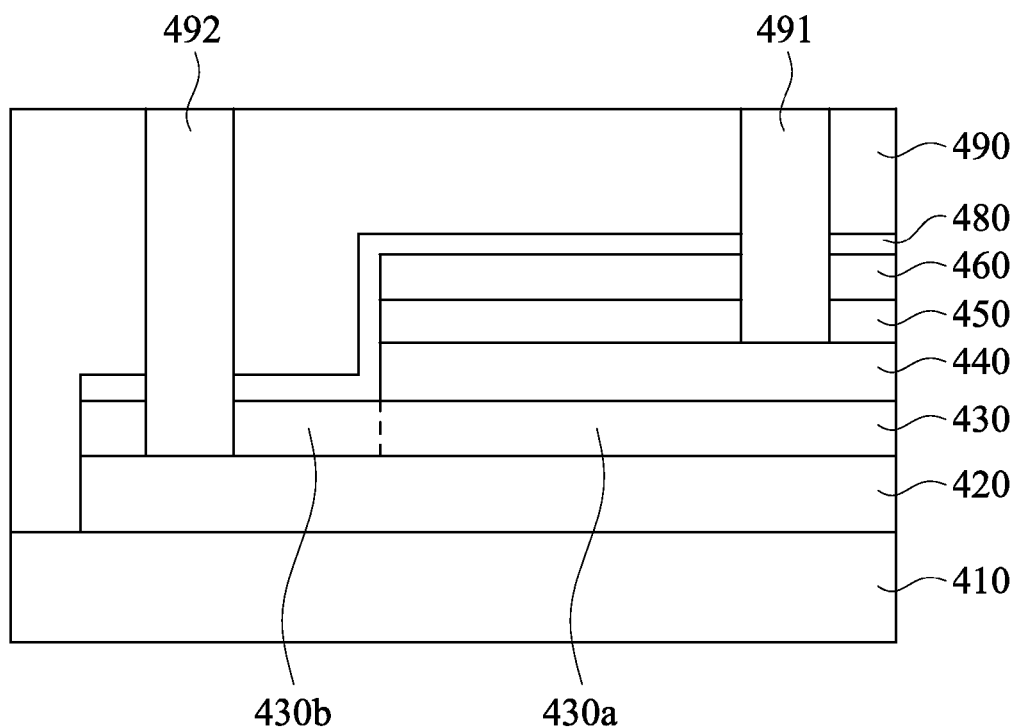

In some embodiments, as shown in FIG. 4L, a first contact plug 491 is formed and electrically connected to the top electrode 440. In certain embodiments, the operation of forming the first contact plug 491 is to first etch the intermetallic dielectric layer 490, the second anti-reflective coating layer 480, and the first anti-reflective coating layer 460, thereby forming a first via (not shown), and then fill the first via with a first conductive material to form the first contact plug 491. In some embodiments, the first conductive material is formed from tungsten, aluminum or copper.

In some embodiments, as shown in FIG. 4L, a second contact plug 492 is formed and electrically connected to the bottom electrode 420. In certain embodiments, the operation of forming the second contact plug 492 is to first etch the intermetallic dielectric layer 490 and the second region 430b of the capacitor dielectric layer 230, thereby forming a second via (not shown), and then fill the second via with a second conductive material to form the second contact plug 492. In some embodiments, the second conductive material is formed from tungsten, aluminum or copper.

Figure 5:
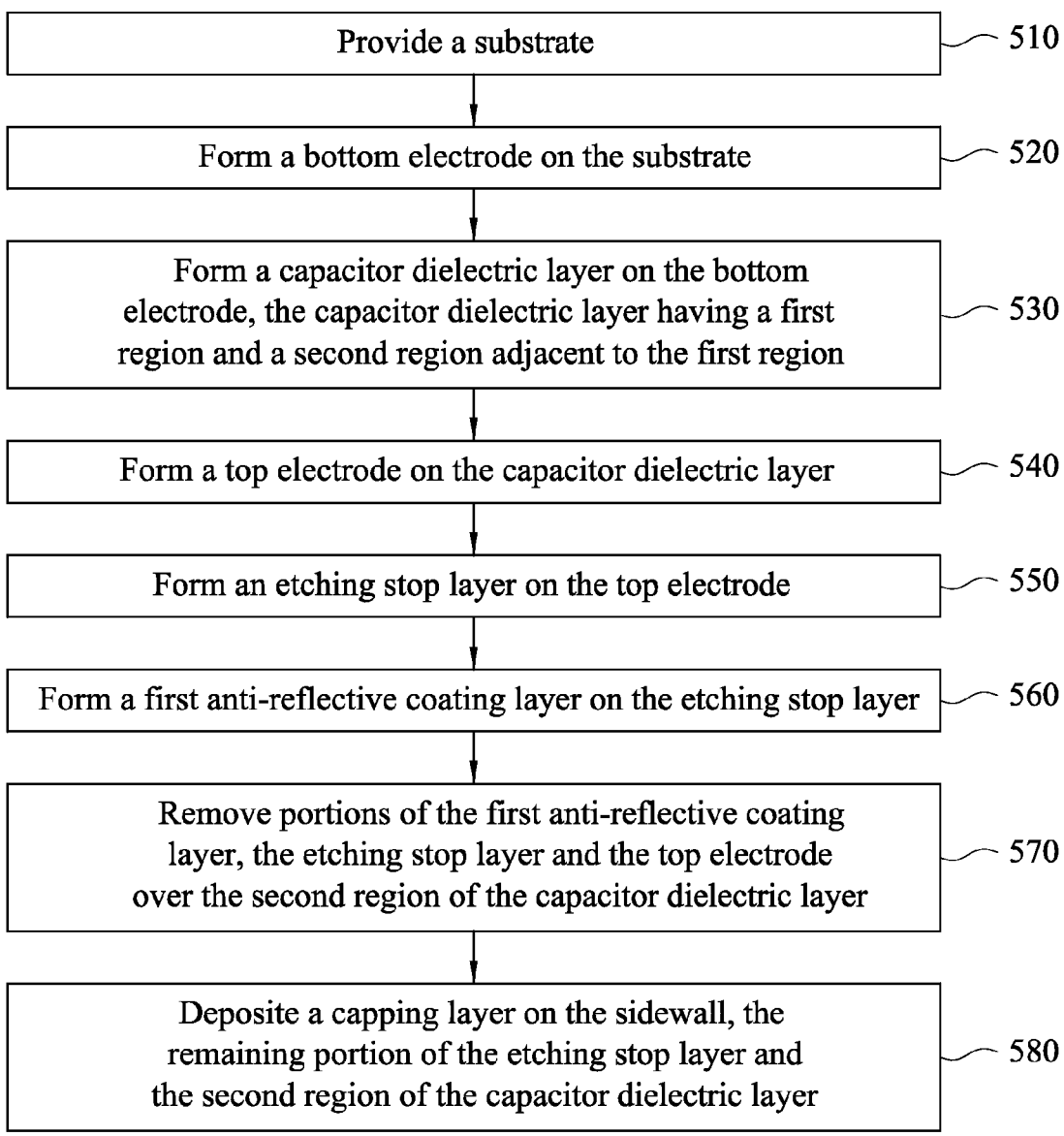
FIG. 5 is a flow chart of a method for fabricating a semiconductor device in accordance with various embodiments.

Referring to FIG. 5 together with FIG. 2A to FIG. 2H, FIG. 5 is a flow chart of a method 500 for fabricating a semiconductor device 200 in accordance with various embodiments. The method 500 begins at operation 510, where a substrate 210 is provided, as shown in FIG. 2A. At operation 520, a bottom electrode 220 is formed on the substrate 210, as shown in FIG. 2B. At operation 530, a capacitor dielectric layer 230 is formed on the bottom electrode 220, in which the capacitor dielectric layer 230 has a first region 230a and a second region 230b adjacent to the first region 230a, as shown in FIG. 2C. At operation 540, a top electrode 240 is formed on the capacitor dielectric layer 230, as shown in FIG. 2D. At operation 550, an etching stop layer 250 is formed on the top electrode 240, as shown in FIG. 2E. At operation 560, a first anti-reflective coating layer 260 is formed on the etching stop layer 250, as shown in FIG. 2F. At operation 570, portions of the first anti-reflective coating layer 260, the etching stop layer 250 and the top electrode 240 over the second region 230b of the capacitor dielectric layer 230 are removed, in which the remaining portions of the first anti-reflective coating layer 260, the etching stop layer 250 and the top electrode 240 together have a sidewall 261, as shown in FIG. 2G. At operation 580, a capping layer 270 is deposited on the sidewall 261, the remaining portion of the etching stop layer 250 and the second region 230b of the capacitor dielectric layer 230, in which the capping layer 270 is formed from oxide or nitride, as shown in FIG. 2H.

Figure 6:
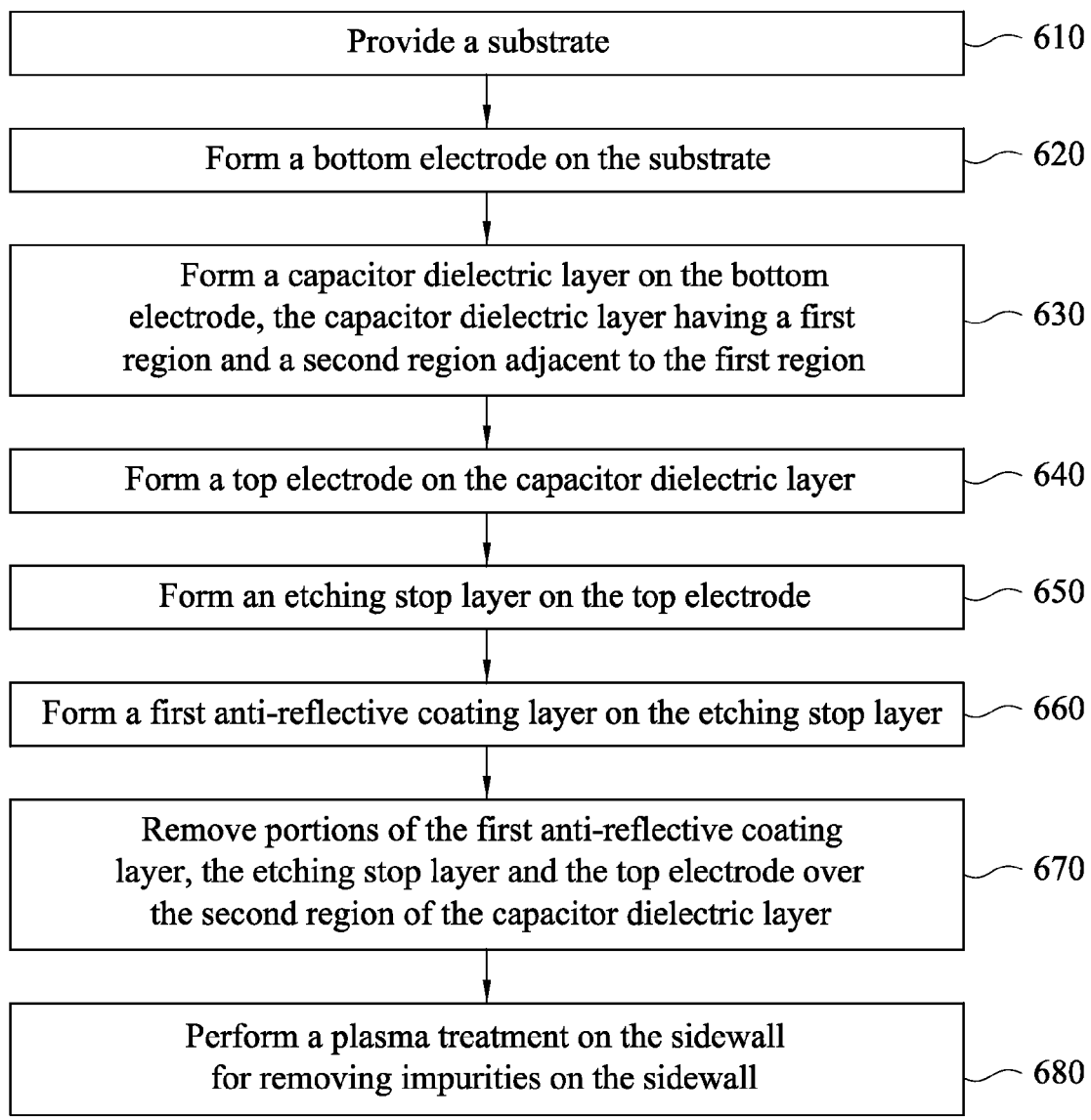
FIG. 6 is a flow chart of a method for fabricating a semiconductor device in accordance with various embodiments.

Referring to FIG. 6 together with FIG. 4A to FIG. 4H, FIG. 6 is a flow chart of a method 600 for fabricating a semiconductor device 400 in accordance with various embodiments. The method 600 begins at operation 610, where a substrate 410 is provided, as shown in FIG. 4A. At operation 620, a bottom electrode 420 is formed on the substrate 410, as shown in FIG. 4B. At operation 630, a capacitor dielectric layer 430 is formed on the bottom electrode 420, in which the capacitor dielectric layer 430 has a first region 430a and a second region 430b adjacent to the first region 430a, as shown in FIG. 4C. At operation 640, a top electrode 440 is formed on the capacitor dielectric layer 430, as shown in FIG. 4D. At operation 650, an etching stop layer 450 is formed on the top electrode 440, as shown in FIG. 4E. At operation 660, a first anti-reflective coating layer 460 is formed on the etching stop layer 450, as shown in FIG. 4F. At operation 670, portions of the first anti-reflective coating layer 460, the etching stop layer 450 and the top electrode 440 over the second region 430b of the capacitor dielectric layer 430 are removed, in which the remaining portions of the first anti-reflective coating layer 460, the etching stop layer 450 and the top electrode 440 together have a sidewall 461, as shown in FIG. 4G. At operation 580, a plasma treatment is performed on the sidewall 461 for removing impurities 462 on the sidewall 461, as shown in FIG. 4H.

In accordance with some embodiments, the present disclosure discloses a semiconductor device. The semiconductor device includes a substrate, a bottom electrode, a capacitor dielectric layer, a top electrode, an etching stop layer, a first anti-reflective coating layer and a capping layer. The bottom electrode is on the substrate. The capacitor dielectric layer is on the bottom electrode. The capacitor dielectric layer has a first region and a second region adjacent to the first region. The top electrode is on the first region of the capacitor dielectric layer. The etching stop layer is on the top electrode. The first anti-reflective coating layer is on the etching stop layer, in which the first anti-reflective coating layer, the etching stop layer and the top electrode together have a sidewall. The capping layer overlies the sidewall, the etching stop layer, and the second region of the capacitor dielectric layer, in which the capping layer is formed from oxide or nitride.

In accordance with certain embodiments, the present disclosure discloses a method for fabricating a semiconductor device. In this method, a substrate is provided. A bottom electrode is formed on the substrate. A capacitor dielectric layer is formed on the bottom electrode, in which the capacitor dielectric layer has a first region and a second region adjacent to the first region. A top electrode is formed on the capacitor dielectric layer. An etching stop layer is formed on the top electrode. A first anti-reflective coating layer is formed on the etching stop layer. Portions of the first anti-reflective coating layer, the etching stop layer and the top electrode over the second region of the capacitor dielectric layer are removed, in which the remaining portions of the first anti-reflective coating layer, the etching stop layer and the top electrode together have a sidewall. A capping layer is deposited on the sidewall, the remaining portion of the etching stop layer and the second region of the capacitor dielectric layer, in which the capping layer is formed from oxide or nitride.

In accordance with alternative embodiments, the present disclosure discloses a method for fabricating a semiconductor device. In this method, a substrate is provided. A bottom electrode is formed on the substrate. A capacitor dielectric layer is formed on the bottom electrode, in which the capacitor dielectric layer has a first region and a second region adjacent to the first region. A top electrode is formed on the capacitor dielectric layer. An etching stop layer is formed on the top electrode. A first anti-reflective coating layer is formed on the etching stop layer. Portions of the first anti-reflective coating layer, the etching stop layer and the top electrode over the second region of the capacitor dielectric layer are removed, in which the remaining portions of the first anti-reflective coating layer, the etching stop layer and the top electrode together have a sidewall. A plasma treatment is performed on the sidewall for removing impurities on the sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
    providing a substrate;
    forming a bottom electrode on the substrate;
    forming a capacitor dielectric layer on the bottom electrode, the capacitor dielectric layer having a first region and a second region adjoining the first region;
    forming a top electrode on the capacitor dielectric layer;
    forming an etching stop layer on the top electrode;
    forming a first anti-reflective coating layer on the etching stop layer;
    removing entire portions of the first anti-reflective coating layer, the etching stop layer, and the top electrode over and aligned with the second region of the capacitor dielectric layer, such that respective sidewalls of the remaining portions of the first anti-reflective coating layer, the etching stop layer, and the top electrode together form a stacked sidewall; and
    depositing a capping layer on the stacked sidewall, the remaining portion of the etching stop layer, and the second region of the capacitor dielectric layer, wherein the capping layer is formed from oxide or nitride.

2. The method of claim 1, further comprising forming a second anti-reflective coating layer on the capping layer.

3. The method of claim 2, further comprising forming an intermetallic dielectric layer on the second anti-reflective coating layer.

4. The method of claim 3, further comprising forming a first contact plug electrically connected to the top electrode, wherein forming the first contact plug electrically connected to the top electrode comprises:
    etching the intermetallic dielectric layer, the second anti-reflective coating layer, the capping layer, and the first anti-reflective coating layer to form a first via; and
    filling the first via with a first conductive material to form the first contact plug.

5. The method of claim 3, further comprising forming a second contact plug electrically connected to the bottom electrode, wherein forming the second contact plug electrically connected to the top electrode comprises:
    etching the intermetallic dielectric layer and the second region of the capacitor dielectric layer to form a second via; and
    filling the second via with a second conductive material to form the second contact plug.

6. The method of claim 1, wherein after removing the first anti-reflective coating layer, the etching stop layer, and the top electrode and before depositing the capping layer on the remaining portion of the etching stop layer and the second region of the capacitor dielectric layer, the method further comprises performing a plasma treatment on the stacked sidewall for removing impurities on the stacked sidewall.

7. The method of claim 6, wherein performing the plasma treatment on the stacked sidewall further comprises removing the impurities on the stacked sidewall using a $N_2O$ plasma.

8. A method for fabricating a semiconductor device, the method comprising:
    providing a substrate;
    forming a bottom electrode on the substrate;
    forming a capacitor dielectric layer on the bottom electrode, the capacitor dielectric layer having a first region and a second region adjoining the first region;
    forming a top electrode on the capacitor dielectric layer;
    forming an etching stop layer on the top electrode;
    forming a first anti-reflective coating layer on the etching stop layer;
    removing entire portions of the first anti-reflective coating layer, the etching stop layer, and the top electrode over and aligned with the second region of the capacitor dielectric layer, such that respective sidewalls of the remaining portions of the first anti-reflective coating layer, the etching stop layer, and the top electrode together form a stacked sidewall; and
    performing a plasma treatment on the stacked sidewall for removing impurities on the stacked sidewall.

9. The method of claim 8, further comprising forming a second anti-reflective coating layer on the first anti-reflective coating layer.

10. The method of claim 9, further comprising forming an intermetallic dielectric layer on the second anti-reflective coating layer.

11. The method of claim 10, further comprising forming a first contact plug electrically connected to the top electrode, wherein forming the first contact plug electrically connected to the top electrode comprises:
    etching the intermetallic dielectric layer, the second anti-reflective coating layer, and the first anti-reflective coating layer to form a first via; and
    filling the first via with a first conductive material to form the first contact plug.

12. The method of claim 10, further comprising forming a second contact plug electrically connected to the bottom electrode, wherein forming the second contact plug electrically connected to the top electrode comprises:
    etching the intermetallic dielectric layer and the second region of the capacitor dielectric layer to form a second via; and filling the second via with a second conductive material to form the second contact plug.

13. The method of claim 8, wherein performing the plasma treatment on the stacked sidewall further comprises removing impurities on the stacked sidewall using a $N_2O$ plasma.

14. The method of claim 1, wherein the first anti-reflective coating layer is formed from silicon oxynitride.

15. The method of claim 1, wherein the capping layer is formed from silicon dioxide.

16. The method of claim 1, wherein the capping layer is formed from nitride.

17. The method of claim 1, wherein the etching stop layer is formed from silicon nitride, silicon carbide, or silicon oxynitride.

18. The method of claim 3, wherein the intermetallic dielectric layer is formed from a low-k dielectric material which is deposited using tetraethyl ortho silicate (TEOS), CVD, PECVD, or low pressure CVD (LPCVD).

19. The method of claim 8, wherein the first anti-reflective coating layer is formed from silicon oxynitride.

20. The method of claim 10, wherein the intermetallic dielectric layer is formed from a low-k dielectric material which is deposited using tetraethyl ortho silicate (TEOS), CVD, PECVD, or low pressure CVD (LPCVD).

* * * * *